United States Patent [19]

Maemura et al.

[11] Patent Number: 5,086,441
[45] Date of Patent: Feb. 4, 1992

[54] FREQUENCY DIVIDER CIRCUIT

[75] Inventors: Kousei Maemura, Itami; Hiroichi Ishida, Amagasaki, both of Japan

[73] Assignee: Mitsubishi Denki Kabushiki Kaisha, Japan

[21] Appl. No.: 484,854

[22] Filed: Feb. 26, 1990

[30] Foreign Application Priority Data

Jun. 12, 1989 [JP] Japan .................. 1-148928

[51] Int. Cl.$^5$ ............................................. H03K 21/38
[52] U.S. Cl. .................... 377/107; 377/111; 377/114; 377/28
[58] Field of Search ............. 377/107, 55, 111, 72, 377/73, 114, 56, 28

[56] References Cited

U.S. PATENT DOCUMENTS

| | | | |
|---|---|---|---|
| 3,258,696 | 6/1966 | Heymann | 377/73 |
| 3,639,740 | 2/1972 | Escoffier et al. | 377/114 |
| 3,930,169 | 12/1975 | Kuhn | 377/107 |
| 3,992,635 | 11/1976 | Suzuki et al. | 377/111 |
| 4,150,337 | 4/1979 | Sheller | 377/114 |
| 4,181,862 | 1/1980 | Dingwall | 377/117 |
| 4,334,194 | 6/1982 | Rittenbach | 377/72 |
| 4,558,457 | 12/1985 | Tabata | 377/111 |
| 4,630,295 | 12/1986 | Kamuro et al. | 377/73 |
| 4,882,505 | 11/1989 | Furman | 377/107 |

FOREIGN PATENT DOCUMENTS 56-79534 6/1981 Japan .
59-156028 9/1984 Japan .

OTHER PUBLICATIONS

Ohhata et al, "A 14mV 2GHz . . . Prescaler", The Transactions of The OEICE, 1987, No. 147, pp. 1–148.
Saito et al, "Intermittent Operation of . . . Synthesizer", The Transactions of the IEICE, No MW87-121, pp. 85–90.

Primary Examiner—John S. Heyman
Attorney, Agent, or Firm—Leydig, Voit & Mayer

[57] ABSTRACT

A frequency divider circuit having N flip-flops connected in series, includes a logic circuit for monitoring at least one of the outputs of the N flip-flops and halting the frequency division operation of a prior stage flip-flop when the value of the output which is monitored is equal to a predetermined value when a reset signal is input, and restarting frequency division operation when the reset signal is cancelled.

6 Claims, 13 Drawing Sheets

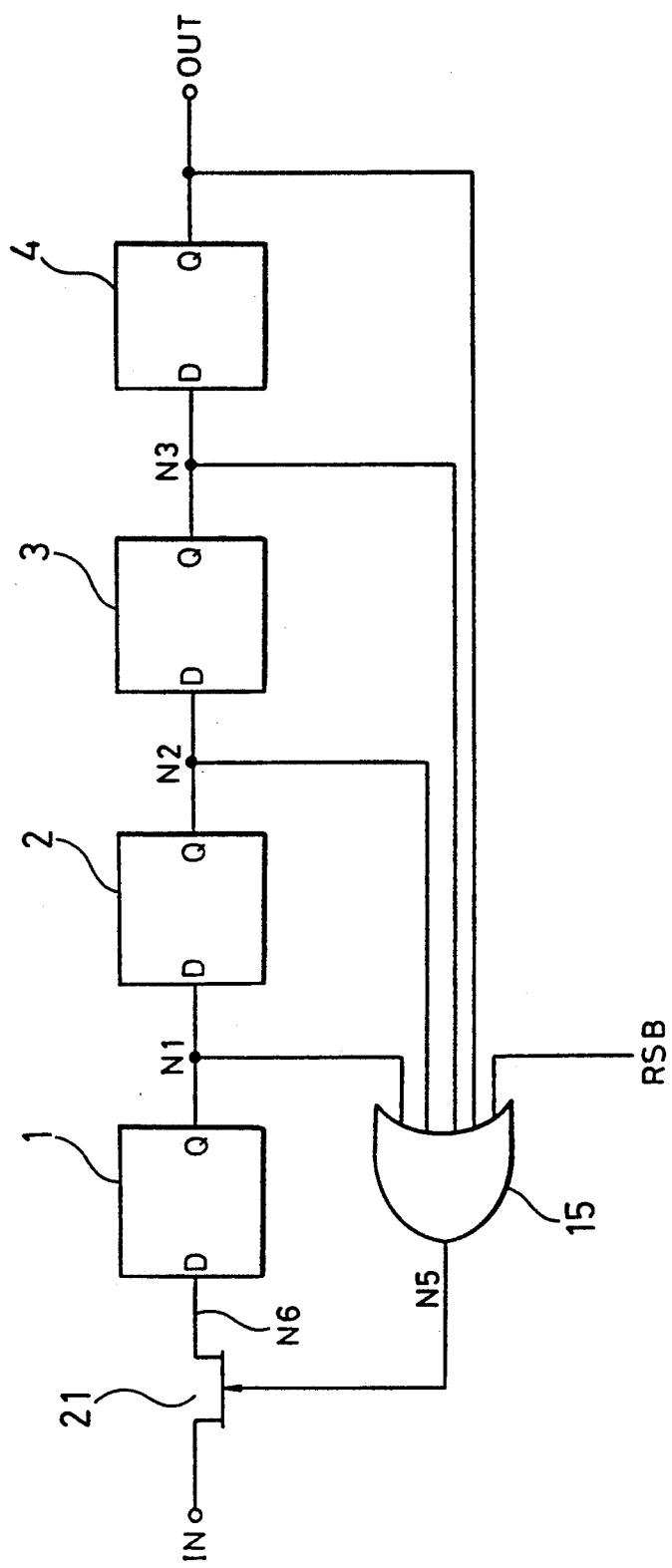

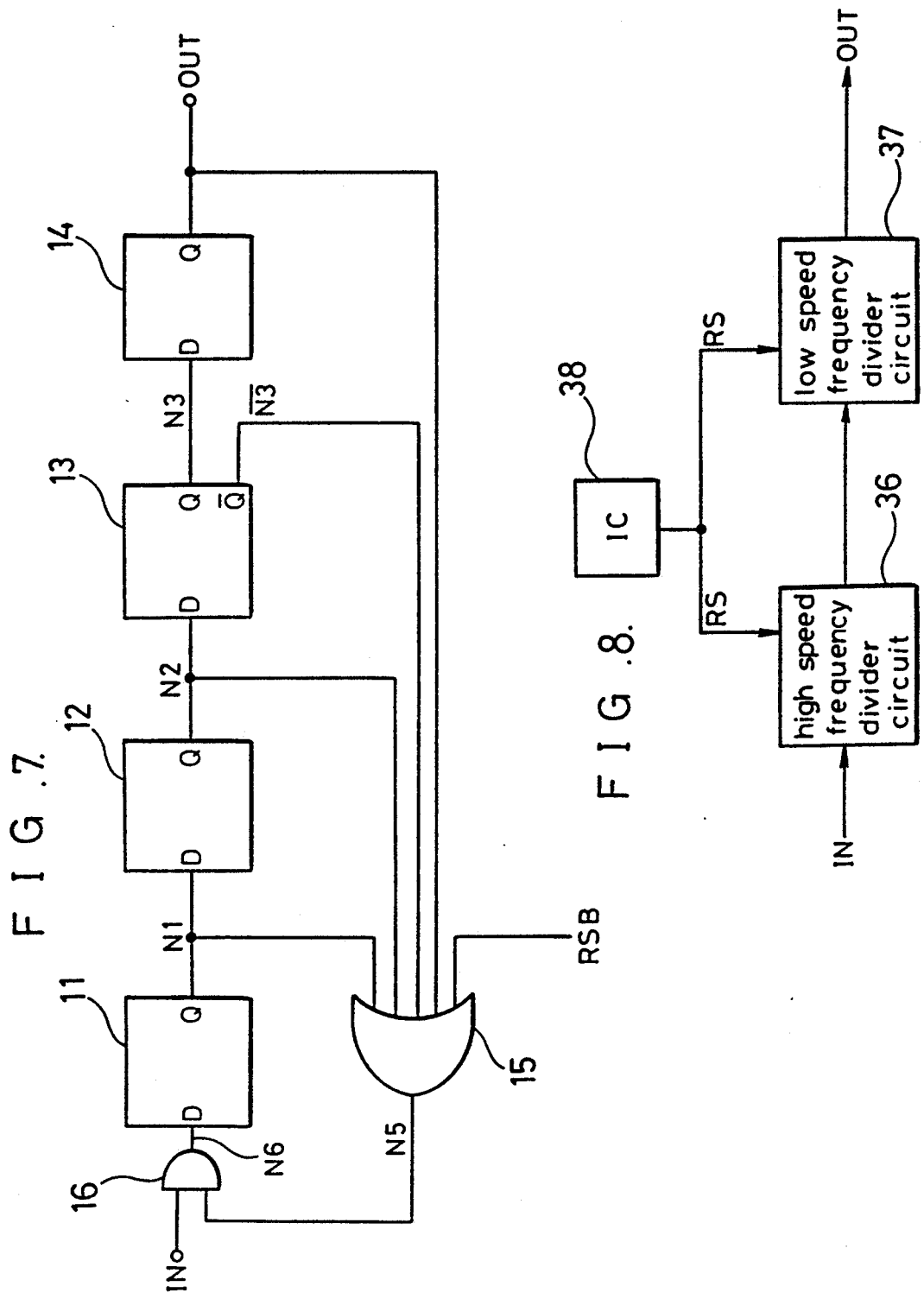

FIG.12A OUT (PRIOR ART)

FIG.12B RS (PRIOR ART)

FREQUENCY DIVIDER CIRCUIT

FIELD OF THE INVENTION

The present invention relates to a frequency divider circuit. More particularly, it relates to a resettable frequency divider circuit and an enhancement of its performance.

BACKGROUND OF THE INVENTION

A construction of a prior art resettable frequency divider circuit will be described.

FIG. 11 shows a construction of a prior art 1/16 frequency divider circuit. In FIG. 11, reference numerals 11B to 14B designate ½ frequency divider circuits, respectively, which are triggered type flip-flops having reset functions. Reference numeral 32 designates a buffer circuit for receiving a reset signal. Reference characters IN and OUT designate a signal input terminal and a signal output terminal of the resettable frequency divider circuit, respectively. Reference characters N1 to N3 designate output terminals of the ½ frequency divider circuits 11B to 13B, respectively. Reference character N4 designates an output terminal of the buffer circuit 32 for the reset signal. Reference character RS designates a reset signal input terminal. Reference characters D, Q, and R designate input terminals, output terminals, and reset signal input terminals of the ½ frequency divider circuits 11B to 14B, respectively.

This frequency divider circuit will operate as follows.

When a reset signal is input to the respective ½ frequency divider circuits 11B to 14B, the internal signals thereof are compulsorily set to "High" or "Low" state. When the reset signal is cancelled, the respective ½ frequency divider circuits divide the input frequency, and the entire circuit conducts a 1/16 frequency division operation.

This operation will be described in detail with reference to FIGS. 12A and 12B.

FIGS. 12A and 12B show a relationship between an output signal and a reset input signal of the resettable frequency divider circuit. Herein, the respective ½ frequency divider circuits are triggered type flip-flops which change their output signals when the input signals are changed to "High", and the internal nodes of the flip-flops are set to "Low" by the reset signal. In FIG. 12A, reference character OUT designates an output signal of the resettable frequency divider circuit. Reference character RS in FIG. 12B designates a reset input signal. Reference character T in FIG. 12A designates the period of the output signal of the frequency divider circuit. When a reset signal is input, all internal nodes of the frequency divider circuit are set to "Low" and the output signal (OUT) is set to a state immediately before "High" state. The output signal (OUT) of the frequency divider circuit becomes "High" when the reset signal is cancelled, and a frequency division is again started. Thus, the time period from the cancellation of the reset signal to the rise of the next output is a period T, and this frequency divider circuit is set to an initial state by the reset signal.

FIG. 14 shows another prior art frequency divider circuit having a division ratio of 1/256 and 1/257. In FIG. 14, reference numeral 33 designates a two-mode frequency divider circuit comprising D flip-flops 33a, 33b, and 33c, which conducts ¼ and 1/5 frequency division, alternatively. Reference numerals 11B to 16B designate ½ frequency divider circuits, respectively, which are T flip-flops. Reference numerals 30, 31, 34, and 35 designate OR circuits. Reference character IN designates a signal input terminal. Reference character MOD designates an input terminal for receiving a frequency division switching signal. Reference character OUT designates an output terminal. Reference character RS designates a reset signal input terminal.

The operation of this frequency divider circuit at the resetting is as follows. When the RS signal is "High", reset signals are input to the respective D flip-flops 33a to 33c and T flip-flops 11B to 16B, and the operation of the entire circuit is halted.

In these prior art frequency divider circuits, in order to conduct a reset operation, all flip-flops are required to have reset functions.

FIG. 13 shows a construction of a ½ frequency divider circuit having a reset function including field effect transistors. In FIG. 13, reference characters J1 to J13, J21, and J22 designate transistors. Reference characters R1 to R4 designate resistors. Reference characters I1 to I3 designate constant current sources. Reference character $V_{DD}$ designates a power supply terminal. Reference character $D_{IN}$ designates an input signal terminal. Reference character $D_R$ designates a reference voltage signal input terminal. Reference character RS designates a reset signal input terminal. Reference character OUT designates an output terminal. In this ½ frequency divider circuit, transistors J21 and J22 are newly provided as compared with a usual ½ frequency divider circuit having no reset function.

The operation of this ½ frequency divider circuit will be briefly described.

When the reset input signal RS is "Low", the transistors J21 and J22 are in OFF states, and the frequency divider circuit operates as it the transistors J21 and J22 were not present, that is, it conducts a ½ frequency division operation. When the reset input signal RS is "High", the transistors J21 and J22 are in ON state and the currents flowing through the resistors R2 and R4 become larger than the currents flowing through the resistors R1 and R3, and the ½ frequency divider circuit is set to "Low" state.

In the prior art resettable frequency divider circuit, transistors for providing a reset function have to be provided inside the respective ½ frequency divider circuits, and this results in a reduction in the operation speed or an increase in the number of elements to provide a reset function. Furthermore, since the reset signals have to be given to all ½ frequency divider circuits, a buffer circuit is required for supplying reset signals to all flip-flops, and this results in an increase in power dissipation.

SUMMARY OF THE INVENTION

It is an object of the present invention to provide a resettable frequency divider circuit that does not reduce operation speed, that reduces power dissipation, and that simplifies circuit construction.

Other objects and advantages of the present invention will become apparent from the detailed description given hereinafter; it should be understood, however, that the detailed description and specific embodiment are given by way of illustration only, since various changes and modifications within the spirit and the scope of the invention will become apparent to those skilled in the art from this detailed description.

According to an aspect of the present invention, a resettable frequency divider circuit comprises means for monitoring at least one of the outputs of flip-flops inside the frequency divider circuit, and means for halting the operation of the prior stage flip-flop which is one stage prior to the flip-flop whose output is monitored when the monitored output is equal to a predetermined value when the reset signal is input. Furthermore, frequency division operation is restarted when reset signal is cancelled. Therefore, a resettable frequency divider circuit is realized by a simple circuit construction, and there is no reduction in the operation speed.

BRIEF DESCRIPTION OF THE DRAWINGS

FIG. 6 is a diagram showing a resettable frequency divider circuit according to a fifth embodiment of the present invention;

FIG. 7 is a diagram showing a resettable frequency divider circuit according to a sixth embodiment of the present invention;

FIG. 8 is a diagram showing a circuit for explaining the effect of the resettable frequency divider circuit of FIG. 7;

DETAILED DESCRIPTION OF THE PREFERRED EMBODIMENTS

An embodiment of the present invention will be described in detail with reference to the drawings.

Figure 1:
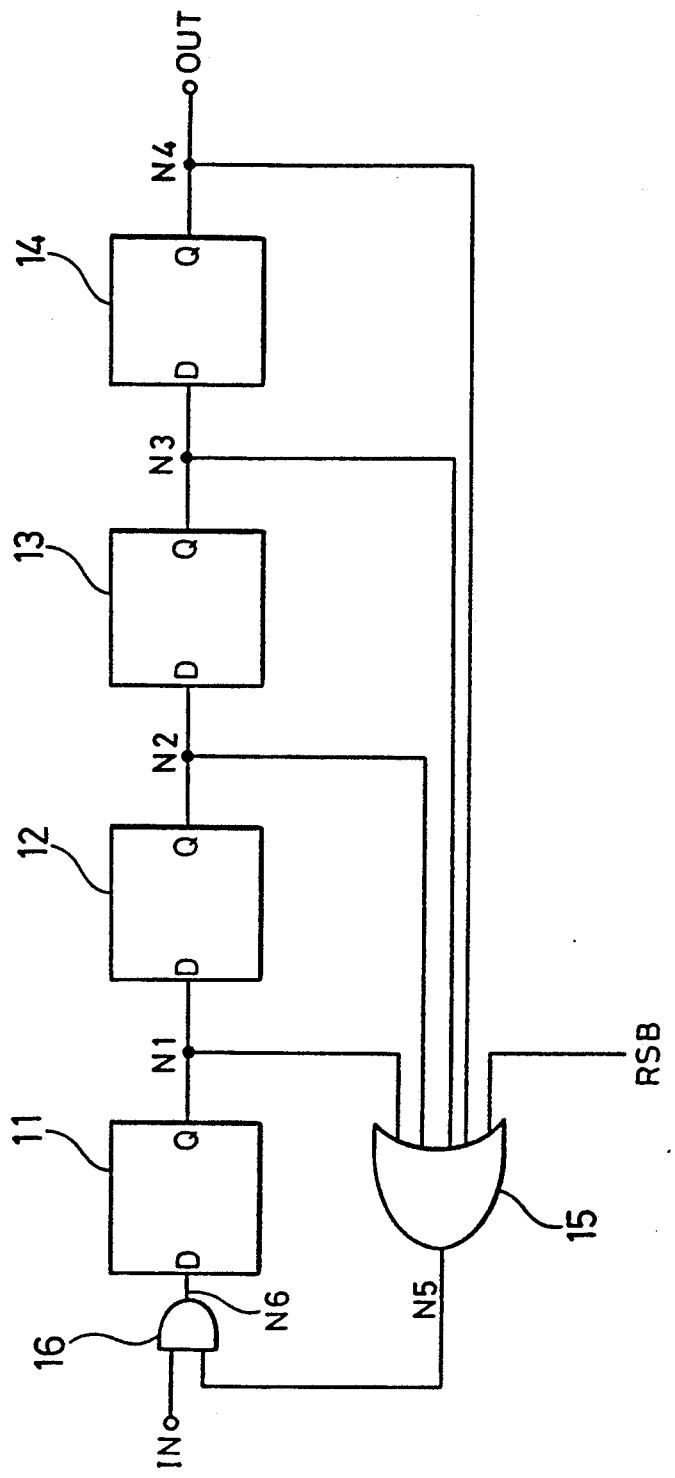
FIG. 1 is a diagram showing a resettable frequency divider circuit according to a first embodiment of the present invention.

FIG. 1 is a diagram showing a construction of a resettable 1/16 frequency divider circuit according to a first embodiment of the present invention. In FIG. 1, reference numerals 11 to 14 designate ½ frequency divider circuits, respectively, which are flip-flops. Reference numeral 15 designates an OR circuit and reference numeral 16 designates an AND circuit. Reference characters IN and OUT designate a signal input terminal and a signal output terminal of the resettable frequency divider circuit, respectively. Reference characters N1 to N4 designate output terminals of the ½ frequency divider circuits 11, 12, 13, and 14. Reference character N5 designates an output terminal of the OR circuit 15 and reference character N6 designates an output terminal of the AND circuit 16. Reference character RSB designates an input terminal for an inverted signal of the reset signal. Reference characters D and Q designate input terminals and output terminals of the ½ frequency divider circuits 11 to 14, respectively.

This resettable frequency divider circuit will operate as follows.

First of all, when a "High" signal is input to the terminal RSB (that is, a state where the reset signal is "Low"), the output N5 of the OR circuit 15 is always "High" and the output N6 of the AND circuit 16 which is an input signal of the first stage flip-flop 11 becomes the input signal IN, and the usual frequency division operation is conducted. In this case, the respective flip-flops 11 to 14 conduct a ½ frequency division operation, and the entire circuit conducts a 1/16 frequency division operation.

Next, when a "Low" signal is input to the terminal RSB (that is, a state where the reset signal is "High"), the output N5 of the OR circuit 15 becomes "Low" when all the signals N1 to N3 and OUT are "Low", and the output N6 of the AND circuit 16 becomes "Low" irrespective of the input signal IN. Thus, the signal input to the first stage flip-flop 11 becomes "Low". Herein, while the input of the respective flip-flops 11 to 14 do not change, the outputs thereof do not change. That is, while N6 does not change from the "Low" state, the output N1 of the flip-flop 11 does not change. While N1 does not change, the output N2 of the flip-flop 12 does not change. In this way, when the prior stage flip-flop is halted, the latter stage flip-flop is halted, and as a result, the operation of all the flip-flops are halted. Then, these flip-flops 11 to 14 are at "Low" state.

Figure 2:
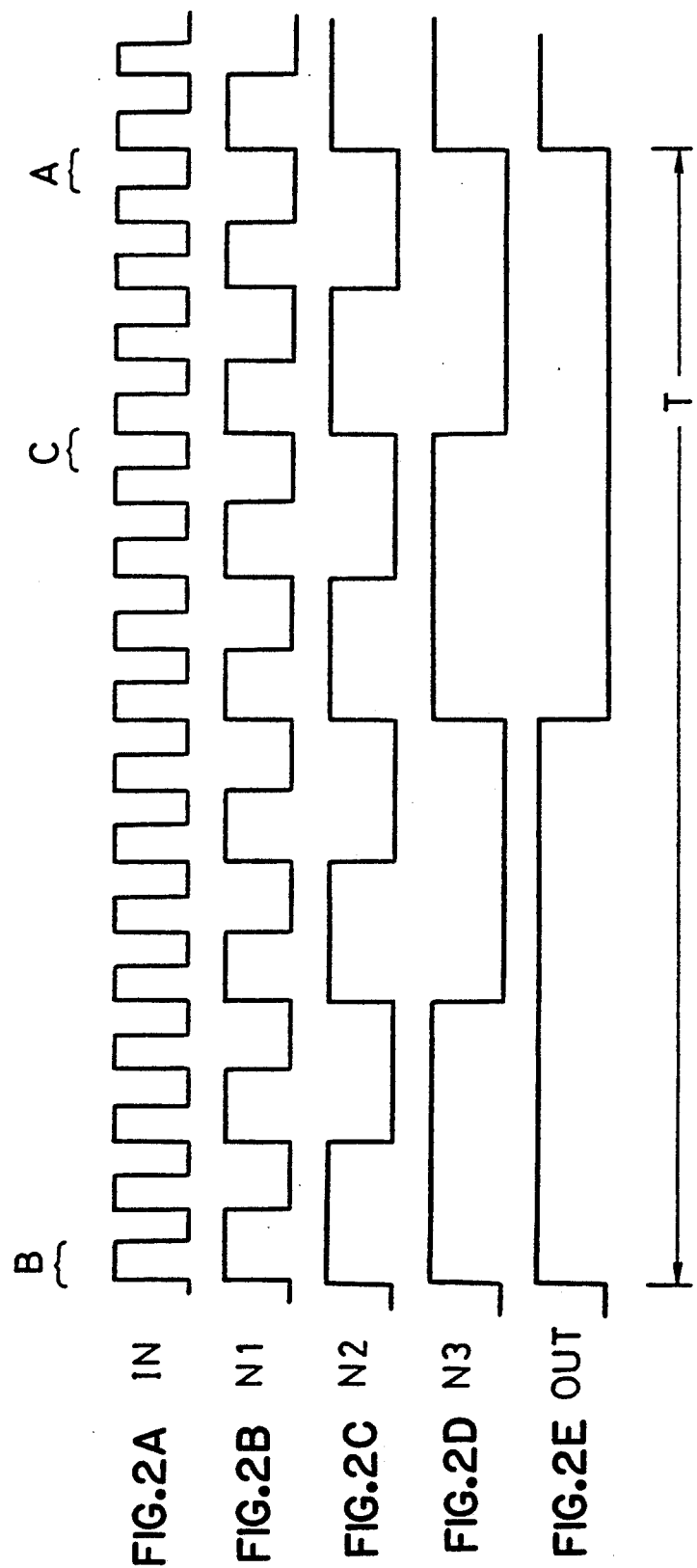
FIGS. 2A-2E are diagrams showing the input and output signals of the resettable frequency divider circuit of FIG. 1 and the output waveforms of the respective flip-flops thereof.

When a "High" signal is input to the terminal RSB in this state (that is, a state where the reset signal is "low"), the output N5 of the OR circuit 15 becomes "High" and the input signal IN of FIG. 2A becomes the output N6 of the AND circuit 16, and the usual frequency division is restarted.

This operation will be described with reference to FIGS. 2A-2E. FIGS. 2A-2E show the relationship between the output signal of the resettable frequency divider circuit and the output signals of the respective partial circuits of the triggered type flip-flops. In FIGS. 2A-2E, reference character OUT (FIG. 2E) designates an output signal of the resettable frequency divider circuit and in FIGS. 2B-2D reference characters N1 to N3 (FIGS. 2B-2D) designate the respective output signals of the flip-flops. Reference character T designates a period of the output signal of the frequency divider circuit. In this frequency divider circuit, it is assumed that the output signals N1, N2, N3, and OUT change when the input signal IN (FIG. 2A) changes from "Low" to "High".

In this case, the relationships between the respective signals are as shown in FIGS. 2A-2E, and the output signals of all the flip-flops become "Low" immediately before the output of the frequency divider circuit OUT changes to "High" from "Low" (refer to A in FIG. 2A-2E). When the output N5 of the OR circuit 15 becomes "Low", the output N6 of the AND circuit 16 becomes "Low" irrespective of the input signal IN, and the operation of the first stage flip-flop 11 is halted and its output N1 is held at "Low" state. When the output N1 of the first stage flip-flop 11 is halted, the latter stage flip-flops 12 to 14 are also halted, and the entire frequency divider circuit holds the state immediately before its output OUT changes to "High". When a "High" signal is input to the terminal RSB in this state, the output N5 becomes "High" and the input signal IN appears at N6, and frequency division operation is started. Since all the flip-flops 11 to 14 are set at "Low" immediately before the frequency division operation is started, the output rises when the signal at the terminal RSB becomes "High", and the same function as that of the prior art resettable frequency divider circuit is realized In this embodiment, the outputs of the respective flip-flops 11 to 14 are monitored, and the operation of the first stag flip-flop 11 is halted when the reset signal is input and the values monitored by the OR circuit all become. At the same time, the operations of the latter stage flip-flops 12 to 14 are halted. Therefore, there is no necessity of effectuating transistors for providing a reset function inside the flip-flops of the frequency divider circuit, whereby a frequency divider circuit which does not reduce operation speed is easily realized.

While in the above-illustrated embodiment an OR circuit 15 is used for monitoring the internal outputs of the frequency divider circuit, other means may be used therefor.

Figure 3:
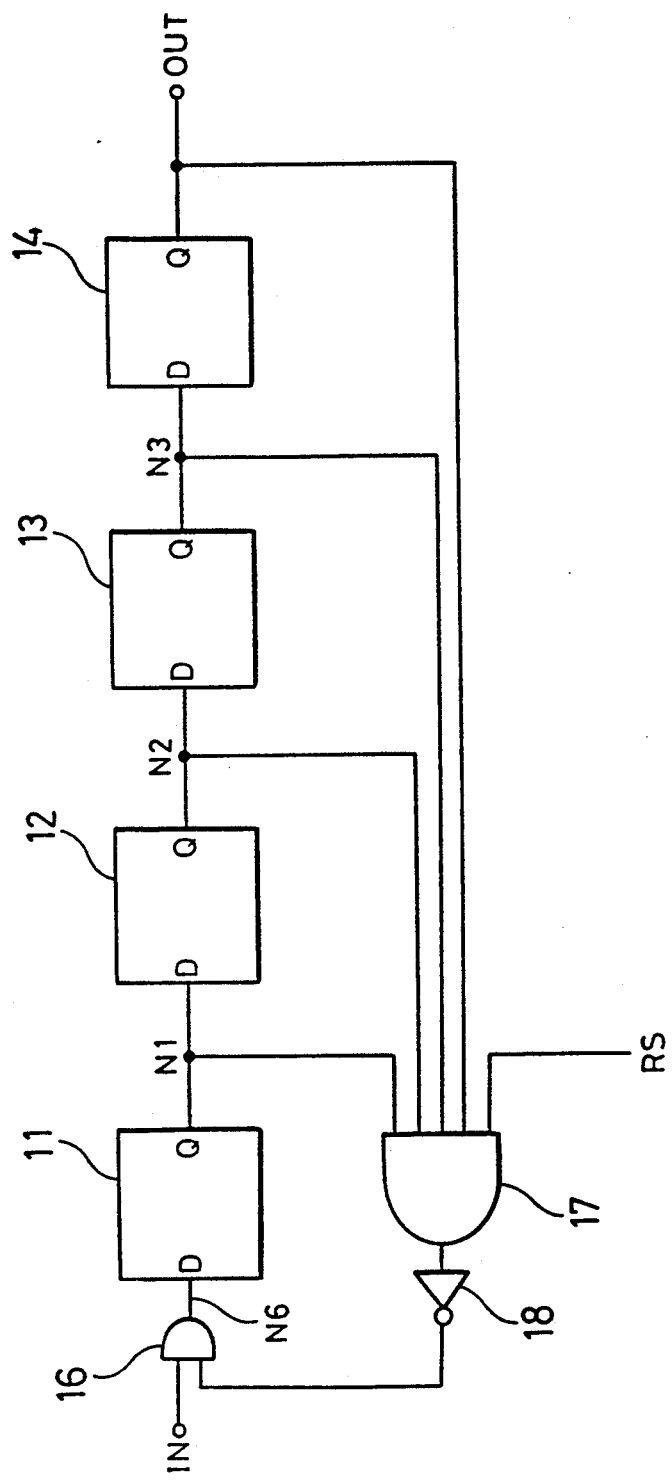
FIG. 3 is a diagram showing a resettable frequency divider circuit according to a second embodiment of the present invention.

FIG. 3 shows a resettable 1/16 frequency divider circuit according to a second embodiment of the present invention. In FIG. 3, the same reference numerals as those shown in FIG. 1 designate the same or corresponding elements. Reference numeral 17 designates an AND circuit, reference numeral 18 designates a NOT circuit, and reference character RS designates a reset signal input terminal.

The device will operate as follows.

When a "Low" signal is input to the terminal RS, the output of the AND circuit 17 is always "Low", and it is inverted by the NOT circuit 18 and the signal input to the AND circuit 16 is always "High". Thus, the input signal IN appears at N6 and the first stage flip-flop 11 conducts the usual frequency division operation.

Next, when a "High" signal is input to the terminal RS, the output of the AN circuit 17 becomes "High" when all the signals N1 to N3 and OUT become "High" (refer to B in FIGS. 2A-2E) and is inverted by the NOT circuit 18, so that the signal input to the AND circuit 16 is always "Low". Thus, the output N6 of the AND circuit 16 always becomes "Low" irrespective of the input signal IN. That is, because the signal input to the first stage flip-flop 11 does not change, operations of all flip-flops are halted.

Figure 4:
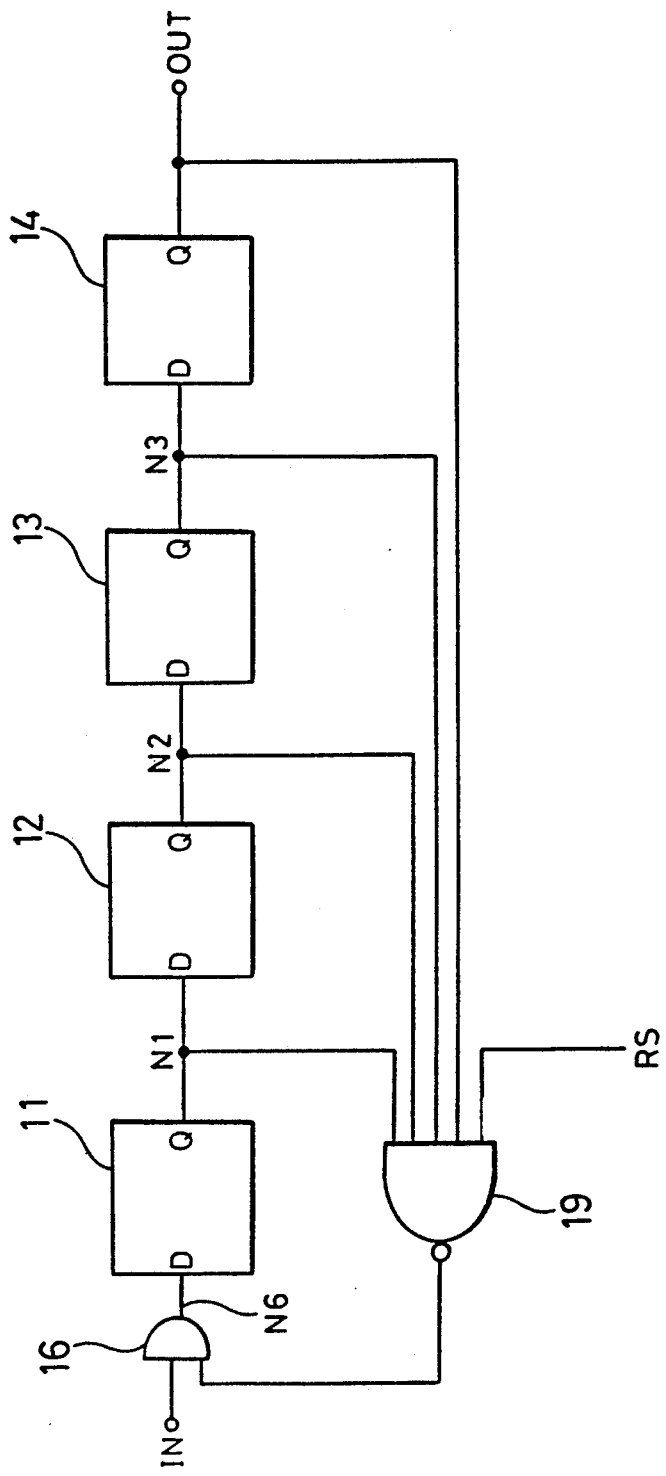
FIG. 4 is a diagram showing a resettable frequency divider circuit according to a third embodiment of the present invention.

In the above-described second embodiment, the signal input to the AND circuit 16 is produced by using the AND circuit 17 and the NOT circuit 18. However, this signal may be produced by using only a NAND circuit 19 as in a third embodiment of the present invention shown in FIG. 4. Also in this case, reset operation can be conducted by the same operation as in the second embodiment.

In the above-described first embodiment, the operation of the frequency divider circuit is reset when all monitored values have become "Low", that is, immediately before the output of the frequency divider circuit OUT changes from "Low" to "High" (refer to A in FIGS. 2A-2E. In the second and third embodiments, the operation of the frequency divider circuit is reset when all monitored values become "High", that is, immediately after the output of the frequency divider circuit OUT changes from "Low" to "High" (refer to B in FIGS. 2A-2E).

While in the first to third embodiments an AND circuit 16 is used as means for halting the frequency division operation of the first stage flip-flop, other circuits may be used as in the following.

Figure 5:
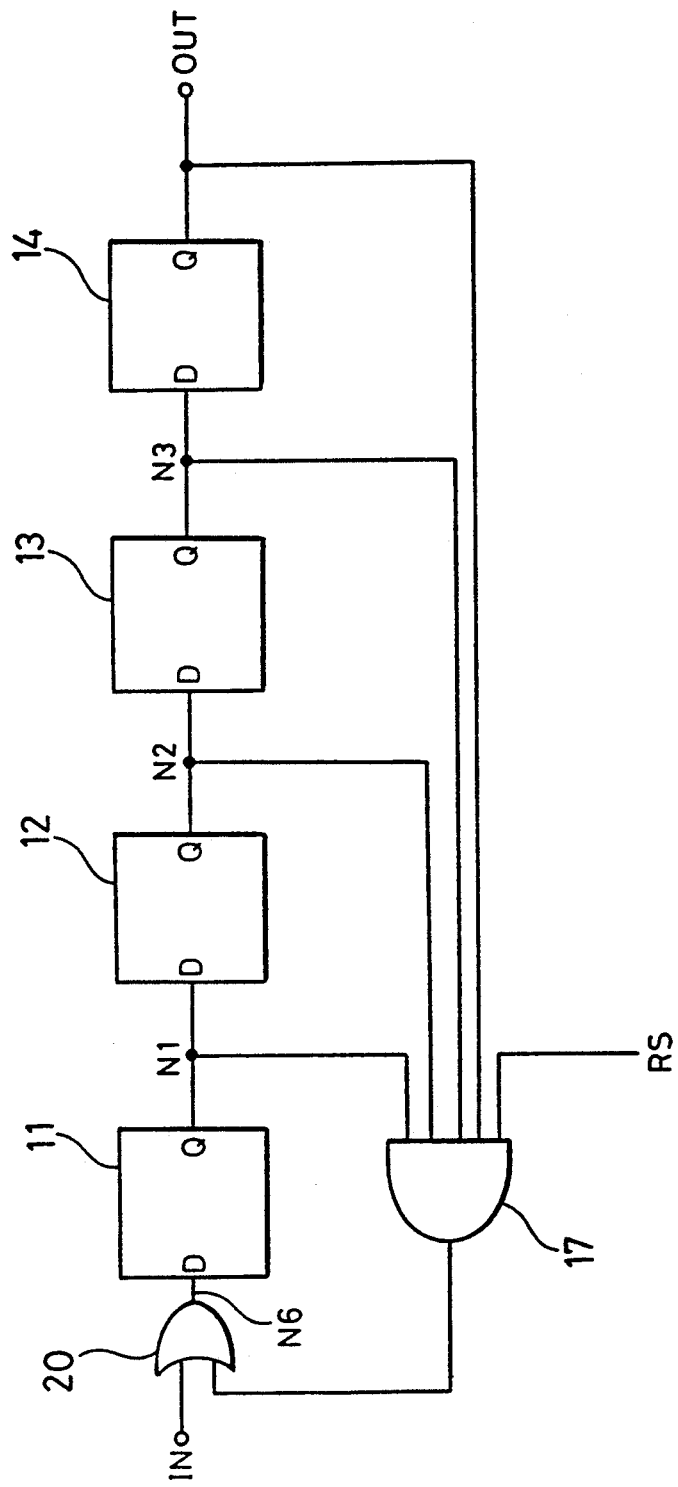
FIG. 5 is a diagram showing a resettable frequency divider circuit according to a fourth embodiment of the present invention.

FIG. 5 shows a resettable 1/16 frequency divider circuit according to a fourth embodiment of the present invention. In FIG. 5, reference numeral 17 designates an AND circuit and reference numeral 20 designates an OR circuit. When a "Low" signal is input to the terminal RS, the output of the AND circuit 17 is always "Low" and the output N6 of the OR circuit 20 is the input signal IN, and the first stage flip-flop 11 conducts the usual frequency division operation. When a "High" signal is input to the terminal RS, the output of the AND circuit 17 becomes "High" when all output signals N1 to N3 and OUT become "High", and the output N6 of the OR circuit 20 becomes "High" irrespective of the input signal IN. Thus, the signal input to the first stage flip-flop 11 becomes "High" and the input signal does not change, whereby the operations of all the flip-flops are halted and are reset.

In the above-described first to third embodiments, an AND circuit 16 is used as a means for halting the input of the first stage flip-flop. However, a switch 21, such as a transistor, may be used as in the fifth embodiment of the present invention as shown in FIG. 6.

In the above-described first to fifth embodiments, the frequency divider circuit is reset immediately before or immediately after the output of the frequency divider circuit OUT changes from "Low" to "High". The present invention is not so restricted and the reset operation can be realized at an arbitrary time.

FIG. 7 shows a resettable frequency divider circuit according to a sixth embodiment of the present invention. The circuit of this sixth embodiment differs from that of the first embodiment shown in FIG. 1 in that the OR circuit 15 receives the inverted output signal N3 as an input signal.

When a "Low" signal is input to the terminal RSB and all the output signals N1, N2, N3, and OUT become "Low", the output of the OR circuit 15 becomes "Low" and the output N6 of the AND circuit 16 becomes "Low" irrespective of the input signal IN, and all the flip-flops are reset. Herein, the period when the output signals N1, N2, N3, and OUT become "Low" is the period C of FIG. 2 when the output signals N1, N2, and OUT are "Low" and N3 is "High". In this case, the OUT is reset at a time after it changes to "High".

The method of changing the output signal at a time after the circuit is reset is especially effective where a high speed frequency divider circuit 36 and a low speed frequency divider circuit 37 are connected in series and they are reset at the same time by the IC circuit 38 as shown in FIG. 8. In this case, the low speed frequency divider circuit 37 requires a longer time after it is reset to the time when its output signal changes as compared with the high speed frequency divider circuit 36. However, the reset operation speed of the high speed frequency divider circuit 36 can be easily coordinated with that of the low speed frequency divider circuit 37 by providing for a change in the output signal at a time after the high speed frequency divider circuit 36 is reset.

Furthermore, while in the above-described first to sixth embodiments the operation of the prior stage flip-flop is halted by halting its input signal, a reset function may be provided only at a prior stage flip-flop. Also in this case, an operation similar to that of the above-described embodiment can be obtained.

Furthermore, in the above-described embodiments, a signal is used only for resetting the frequency divider circuit. However, if the frequency divider circuit is of a type in which the power supply current is controllable by a signal from an external circuit, the external signal can be also used as a reset signal. Such an embodiment will be described.

Figure 9:
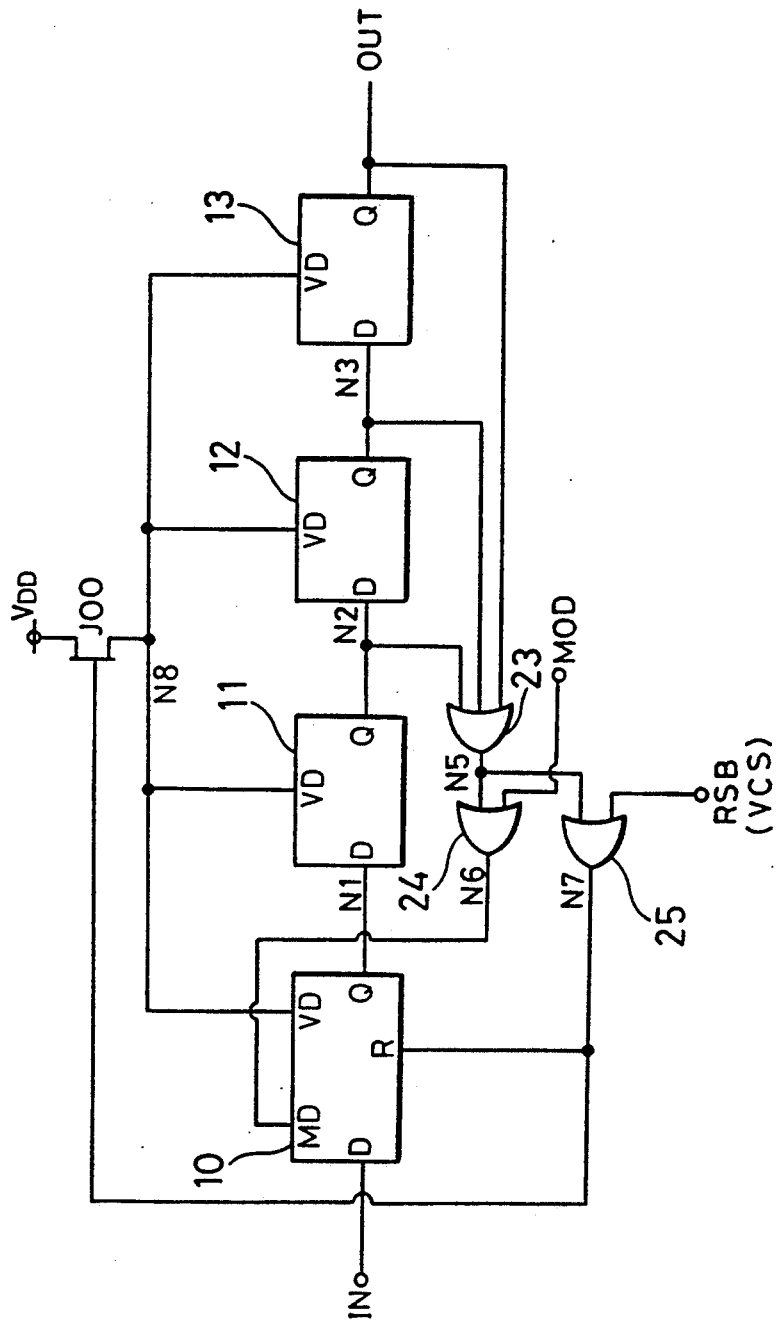
FIG. 9 is a diagram showing a resettable frequency divider circuit according to a seventh embodiment of the present invention.

FIG. 9 shows a resettable frequency divider circuit according to a seventh embodiment of the present invention. In this resettable frequency divider circuit, a two-mode frequency divider circuit of 1/33 and 1/32 modes has a reset function and a current adjusting function. In FIG. 9, reference numeral 10 designates a two-mode frequency divider circuit of ¼ and 1/5 modes having a reset function. Reference numerals 11 to 13 designate ½ frequency divider circuits. Reference numerals 23, 24, and 25 designate OR circuits. Reference numeral J00 designates a transistor for adjusting circuit current. Reference character IN designates a signal input terminal. Reference character MOD designates a frequency division number switching input terminal. Reference character OUT designates an output terminal. Reference character RSB designates an input terminal of an inverted reset signal. Reference character N1 designates an output signal of the two-mode frequency divider circuit 10. Reference characters N2 and N3 designate output signals of the ½ frequency divider circuits. Reference characters N5, N6, and N7 designate output signals of the OR circuits 23, 24, and 25, respectively. Reference character N8 designates a source electrode of the transistor J00 that this is connected to the power supply terminals VD of the respective frequency divider circuits 10 to 13. Reference characters D, Q, R, VD, and MD designate an input terminal, an output terminal, a reset input terminal, a power supply terminal, and a frequency division number switching terminal, of the frequency divider circuits 10 to 13, respectively.

This frequency divider circuit will operate as follows.

When a "High" signal is input to the terminal RSB (that is, a state where the reset signal is "Low"), the output N7 of the OR circuit 25 always becomes "High" and the two-mode frequency divider circuit 10 operates normally, and a normal current is supplied to the respective frequency divider circuits because the transistor J00 is in the ON state. In this case, the two-mode frequency divider circuit 10 conducts a 1/5 frequency division operation when the output N6 is "Low" and it conducts a ¼ frequency division operation when the output N6 is "High". Only when the MOD is "Low" and N2, N3 and OUT are all "Low", the output N6 of the OR circuit 24 becomes "Low", and the two-mode frequency division circuit 10 conducts a 1/5 frequency division operation. Thus, the entire frequency division circuit conducts a 1/(5+4×7), that is, 1/33 frequency division operation. On the other hand, when the MOD is "high", N6 is always "High" and the two-mode frequency division 10 always conducts a ¼ frequency division operation. Thus, the entire frequency division circuit conducts a 1/(4×8), that is, 1/32 frequency division operation.

Next, when the RSB signal is "Low" (that is, the reset signal is "High"), the output N7 of the OR circuit 25 becomes "Low" when N5 is "Low", that is, N2, N3, and OUT are all "Low", and a signal "Low" is input to the reset terminal R of the two-mode frequency division circuit 10, whereby the operation of the two-mode frequency division circuit 10 is halted. Since the respective circuits 10 to 13 are frequency divider circuits, their outputs do not change while their inputs do not change. Therefore, when the operation of the prior stage frequency divider circuit is halted, the latter stage frequency divider circuit will be halted. As a result, the operations of all circuits are halted.

Furthermore, when the output signal N7 becomes "Low", the circuit current of the frequency divider circuit is lowered by the transistor J00 provided between the power supply $V_{DD}$ and the frequency divider circuit. Then, the states of the respective circuits 10 to 13 are "Low". When the RSB signal changes to "High" (that is, a state where the reset signal is "Low"), the output N7 of the OR circuit 25 changes to "High", and the reset signal of the two-mode frequency divider circuit 10 is cancelled and the usual frequency division operation is started.

In the above-described seventh embodiment, similarly as in the other above-described embodiments, the reset function can be provided in the two-mode frequency divider circuit 10 without altering the circuit construction and there is no reduction in the operation speed. Furthermore, in this seventh embodiment, the circuit current of the frequency divider circuit is reduced during the reset operation, whereby the power dissipation can be reduced.

Figure 10:
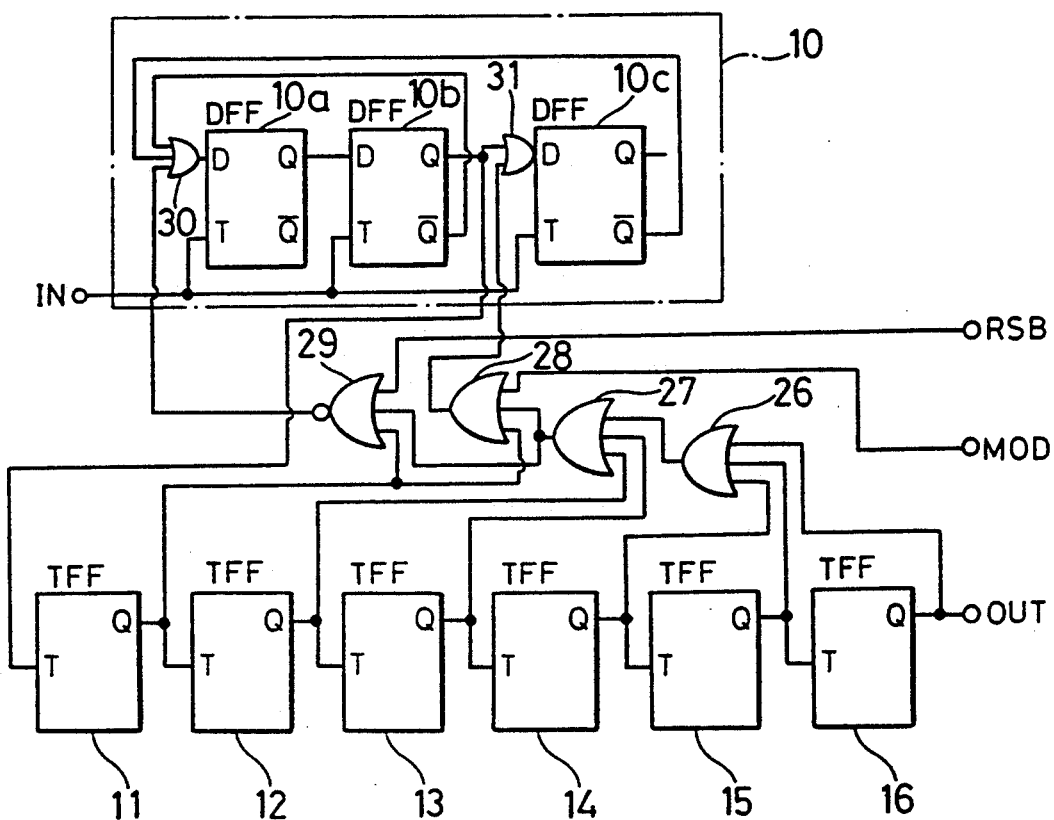
FIG. 10 is a diagram showing a resettable frequency divider circuit according to an eighth embodiment of the present invention.
Figure 11:
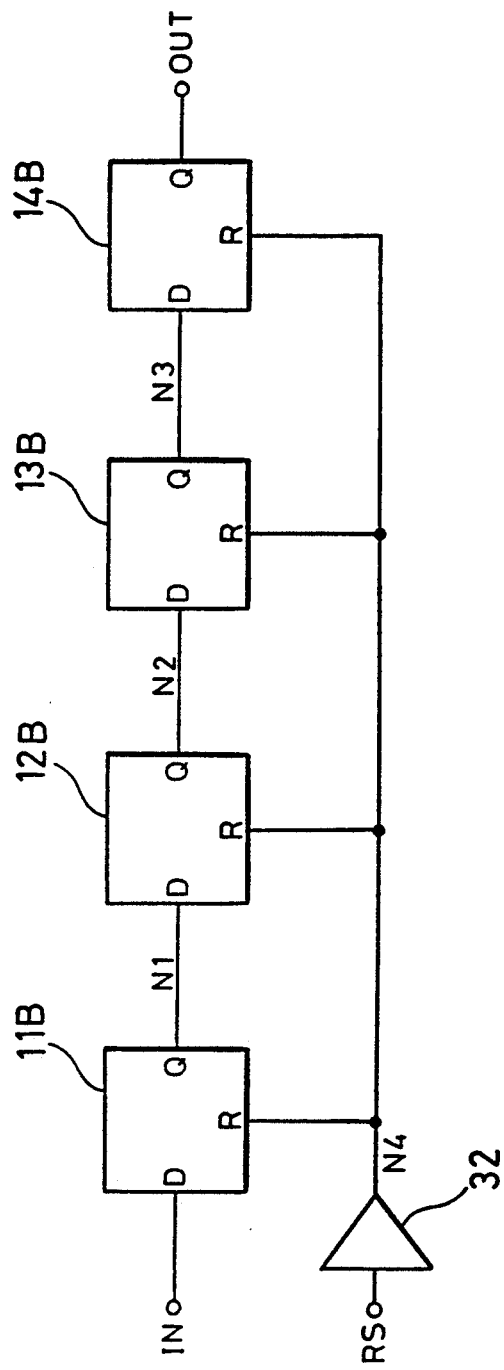
FIG. 11 is a diagram showing a prior art resettable frequency divider circuit.
Figure 12:
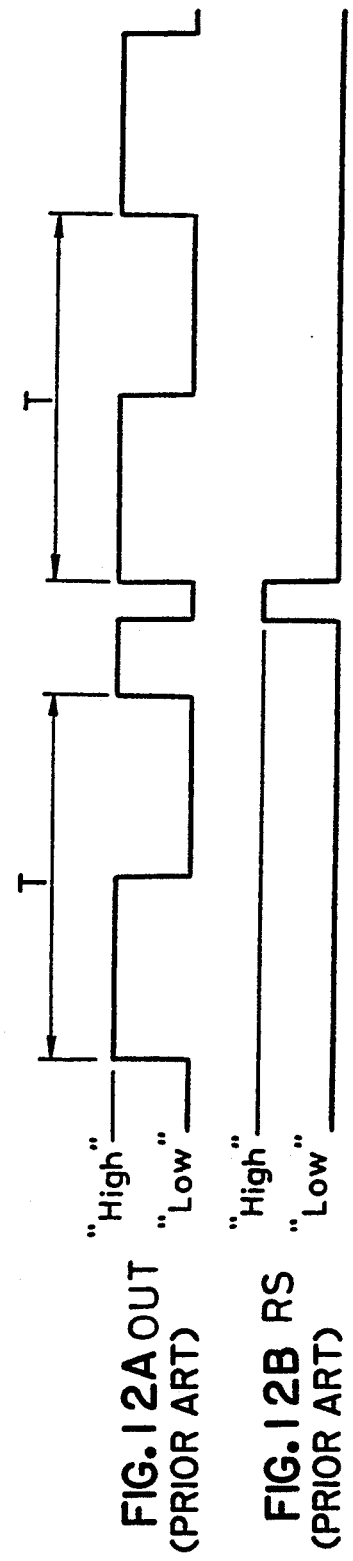
FIGS. 12A and 12B are diagrams showing the relationship between a reset input signal and an output signal of the resettable frequency divider circuit according to the prior art, respectively.
Figure 13:
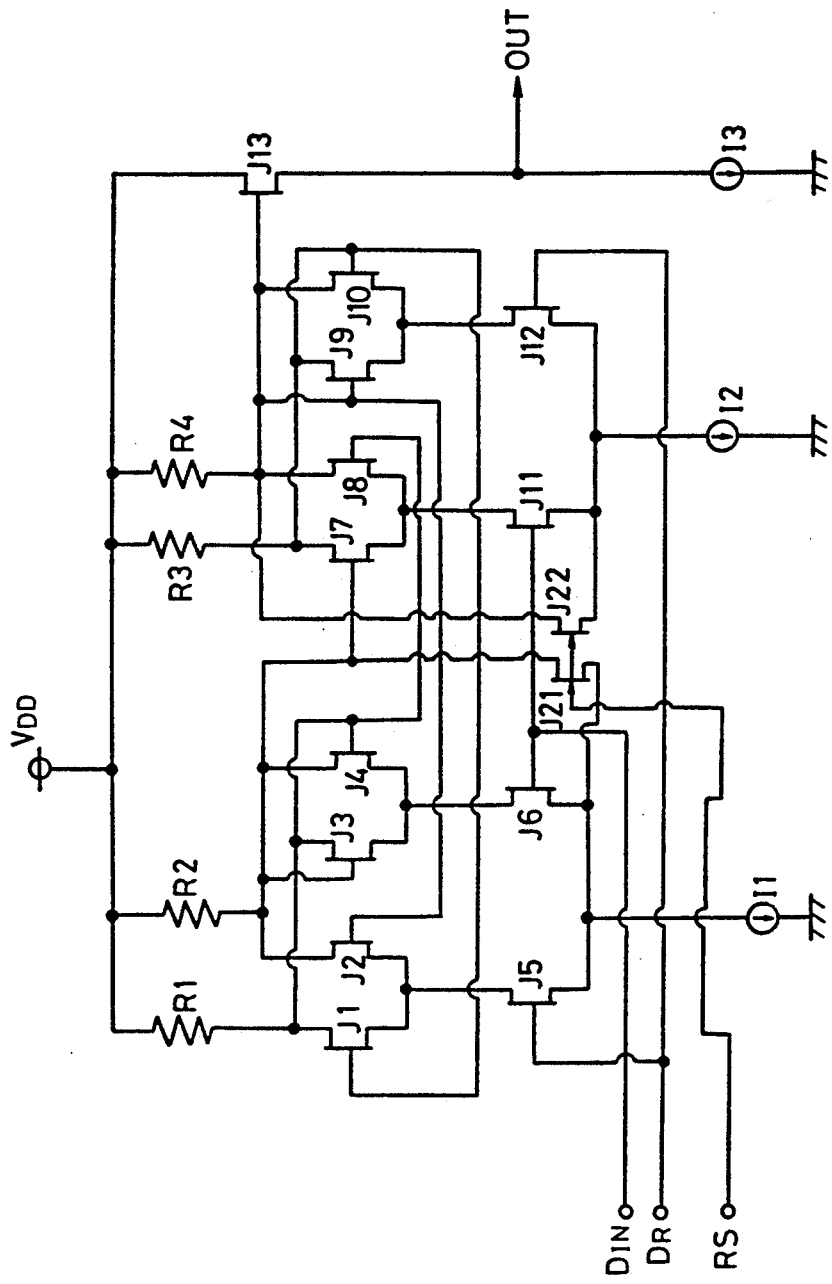
FIG. 13 is a diagram showing a ½ frequency divider circuit having a reset function including field effect transistors.
Figure 14:
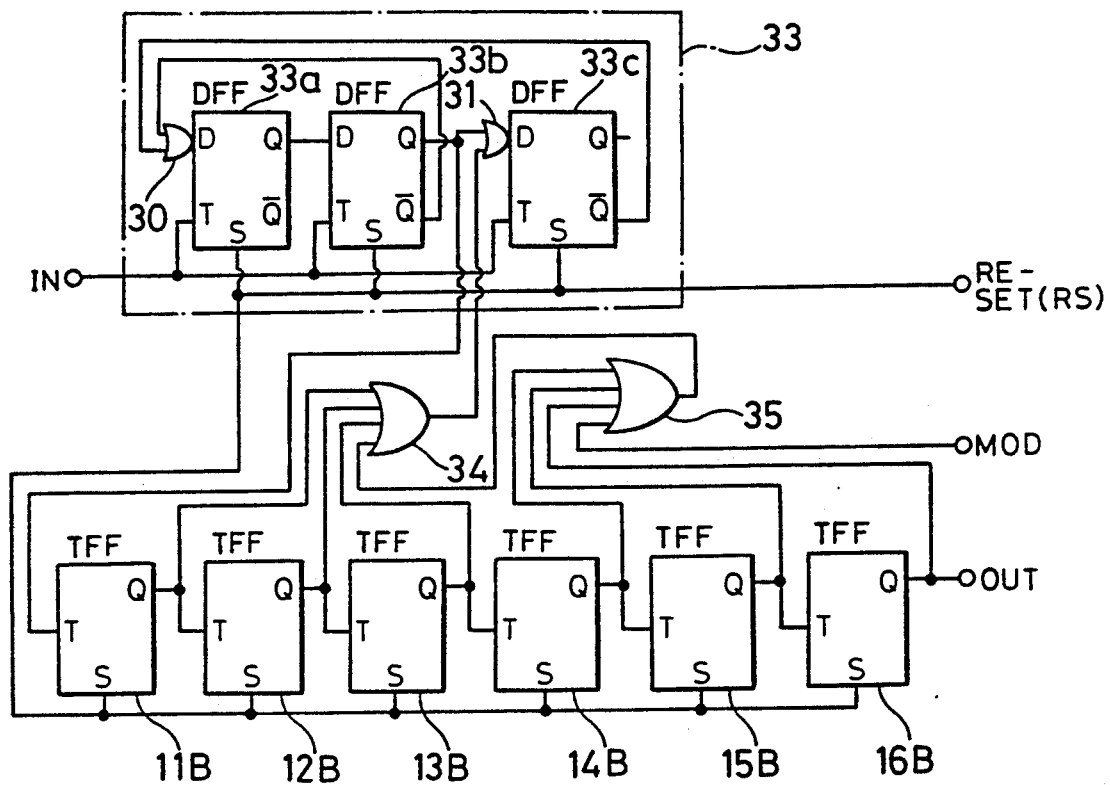
FIG. 14 is a diagram showing a resettable frequency divider circuit according to the prior art.

FIG. 10 shows an eighth embodiment of the present invention, in which a reset function is provided in a two-mode frequency divider circuit having 1/256 and 1/257 modes. In FIG. 10, reference numeral 10 designates a two-mode frequency divider circuit having ¼ and 1/5 modes. Reference numerals 10a, 10b, and 10c designate D flip-flops. Reference numerals 11 to 16 designate ½ frequency division T flip-flop circuits. Reference numerals 26, 27, 28, 30, and 1 designate OR circuits. Reference numeral 29 designates a NOR circuit.

The operation of this frequency divider circuit in the reset operation will be described. When a "Low" signal is input to the terminal RSB (that is, the reset signal is "High"), the output of the NOR circuit 29 becomes "High" when all the outputs of the T flip-flops 11 to 16 are "Low". The output of the OR circuit 30, which is at the prior stage of the two-mode frequency divider circuit 10, always becomes "High", and a "High" signal is always input to the input data terminal D of the D flip-flop 10a, and the operation of the first stage two-mode frequency divider circuit 10 is halted. As a result, the operation of the entire circuit is halted.

In this eighth embodiment, there is provided a logic circuit in which the outputs of the respective flip-flops are monitored and a "High" signal is always input to the data input at the first stage of the D flip-flop when all the outputs which are monitored are "Low". Reset is accomplished by the first stage flip-flop being halted. Therefore, the frequency divider circuit can be easily provided with a reset function without changing the circuit construction of the flip-flops, and a frequency divider circuit having a high precision reset function which does not reduce operation speed is realized.

As is evident from the foregoing description, according to the present invention, there the outputs of the flip-flops inside the entire frequency divider circuit are monitored and the operation of the prior stage flip-flop which is one stage prior to the flip-flops whose output are monitored may be halted. Therefore, a resettable frequency divider circuit with a simple circuit construction and without a reduction in operation speed is achieved because alteration of circuit for the reset function has no influence on the frequency divider circuit. Furthermore, a resettable frequency divider circuit can be easily realized from a frequency divider circuit having no reset function.

In a construction where the operation of the prior stage flip-flop, which is one stage prior to the flip-flop whose output is monitored, is halted when the monitor value is equal to a predetermined value and the monitor value is set at the predetermined value immediately before the frequency operation is restarted, the power dissipation can be reduced because the circuit current of the frequency division circuit can be lowered.

What is claimed is:

1. A frequency divider circuit comprising:
    N T-type flip-flops, each flip-flop having an input terminal and an output terminal, connected in series for frequency division of an input signal, where N is an integer;
    logic means connected to the output terminals of the flip-flops for monitoring an output signal produced by at least one of said N T-type flip-flops, for halting frequency division by a prior stage T-type flip-flop in series immediately prior to said T-type flip-flop whose output signal is monitored, for reducing a power supply current flowing in said frequency divider circuit when the monitored output signal is equal to a predetermined value and a reset signal is input to said logic means, for restarting frequency division by said frequency divider circuit when the reset signal is cancelled, and for setting said power supply current to a predetermined value immediately before restarting frequency division.

2. A frequency divider circuit as defined in claim 1 including reset means connected only to said prior stage T-type flip-flop for generating a reset signal for halting frequency division by said prior stage flip-flop.

3. A frequency divider circuit as defined in claim 1 wherein said prior stage T-type flip-flop includes a rest terminal connected to said logic means, and said prior stage T-type flip-flop is reset and said power supply current is reduced in response to an output signal produced by said logic means when the monitored output signal is equal to a predetermined value.

4. A frequency divider circuit as defined in claim 3 including a power supply and a transistor interconnected between said power supply and said T-type flip-flops wherein said logic means comprises an OR circuit receiving the monitored signal and an inverted reset signal, and said OR circuit producing an output signal input to said reset terminal of said prior stage T-type flip-flop and to said transistor for halting frequency division by said prior stage T-type flip-flop and reducing the power supply current of said frequency divider circuit when the signals received by said OR circuit are all Low level.

5. A frequency divider circuit comprising:
    N T-type flip-flops, each flip-flop having an input terminal and an output terminal, connected in series for frequency division of an input signal, where N is an integer;
    a transistor interconnected between an input terminal of said frequency divider circuit and an input terminal of one of said N T-type flip-flops; and
    logic means connected to the output terminals of the flip-flops for monitoring an output signal produced by at least one of said N T-type flip-flops, for halting frequency division by a prior stage T-type flip-flop connected in series immediately prior to said T-type flip-flop whose output signal is monitored, connected to said transistor for electrically isolating said input of said frequency divider circuit from said prior stage flip-flop when the value of the monitored output signal is equal to a predetermined value and a reset signal is input, and for restarting frequency division by said frequency divider circuit when the reset signal is cancelled.

6. A frequency divider circuit comprising:
    M counters connected in series for frequency division of an input signal at respectively different frequencies, where M is an integer greater than one, at least one of said counters containing N T-type flip-flops connected in series, where N is an integer greater than two; and
    logic means connected to the output terminals of said T-type flip-flops for monitoring an output signal produced by at least one of said N T-type flip-flops, for halting frequency division by a prior stage T-type flip-flop connected in series immediately prior to said T-type flip-flop whose output signal is monitored, for resetting each of the M counters whose output is not monitored including means for reducing the power to all said counters when the monitored output signal is equal to a predetermined value and a reset signal is input to said logic means, and for restarting frequency division by said frequency divider circuit and for releasing said M counters when the reset signal is cancelled while simultaneously reestablishing normal power.

* * * * *